United States Patent [19]

Oh

[11] Patent Number: 5,986,863

[45] Date of Patent: Nov. 16, 1999

[54] ELECTROSTATIC DISCHARGE PROTECTION CIRCUITS INCLUDING CIRCUMFERENTIAL GUARD RINGS

[75] Inventor: Sae-Choon Oh, Seoul, Rep. of Korea

[73] Assignee: Samsung Electronics Co., Ltd., Rep. of Korea

[21] Appl. No.: 09/002,826

[22] Filed: Jan. 5, 1998

[30] Foreign Application Priority Data

Jan. 6, 1997 [KR]  Rep. of Korea .............................. 97-91

[51] Int. Cl.$^6$ ..................................................... H02H 9/00
[52] U.S. Cl. .............................. 361/56; 361/111; 361/127
[58] Field of Search ................................ 361/56, 91, 111, 361/117, 118, 119, 127

[56] References Cited

U.S. PATENT DOCUMENTS

| | | | |
|---|---|---|---|
| 4,757,363 | 7/1988 | Bohm et al. | 357/23.13 |
| 5,329,143 | 7/1994 | Chan et al. | 257/173 |
| 5,637,900 | 6/1997 | Ker et al. | 257/355 |

*Primary Examiner*—Jeffrey Gaffin
*Assistant Examiner*—Stephen Jackson

*Attorney, Agent, or Firm*—Myers Bigel Sibley & Sajovec

[57] ABSTRACT

Electrostatic discharge (ESD) protection circuits include first and second pads on an integrated circuit and first and second well regions in the integrated circuit substrate. The first and second well regions include respective first and second circumferences or walls. First and second diodes are included in the respective first and second well regions. The first and second diodes are serially connected between the first and second pads. A first guard ring is included adjacent the first circumference, and preferably in the first well. The first diode is included within the first guard ring. A second guard ring is also preferably included adjacent the second circumference, and most preferably in the second well. The second diode is included within the second guard ring. The first and second well regions preferably are of first conductivity type, and the ESD protection circuit further includes a third well region of second conductivity type in the integrated circuit substrate, between the first and second well regions. The first and second guard rings are of the first conductivity type at higher concentration than the first and second well regions.

13 Claims, 3 Drawing Sheets

ELECTROSTATIC DISCHARGE PROTECTION CIRCUITS INCLUDING CIRCUMFERENTIAL GUARD RINGS

FIELD OF THE INVENTION

This invention relates to integrated circuit devices, and more particularly to electrostatic discharge protection circuits for integrated circuits.

BACKGROUND OF THE INVENTION

Electrostatic discharge (ESD) protection circuits are widely employed in integrated circuits to protect against high voltage spikes that may be applied to pads (also referred to as pins) of an integrated circuit. These high voltage spikes may be caused by discharge of a built-up static charge resulting from human handling of the integrated circuit. ESD protection circuits may be applied to power supply pads, ground pads or input/output pads (including instruction, data and address pads) of integrated circuit devices.

FIG. 1 is a circuit diagram of a conventional ESD protection circuit. As shown in FIG. 1, a conventional ESD protection circuit includes diodes D1–D4 that are connected between first and second pads 1 and 2 on an integrated circuit substrate. As shown in FIG. 1, pad 1 is a first power supply pad Vcc1 and pad 2 is a second power supply pad Vcc2. However, ground pads or input/output pads may also be used. As shown, a plurality of internal circuits 3 and 4 are also connected to the first and second pads 1 and 2 and are protected by the ESD protection circuit.

FIG. 2 is a cross-sectional view of an integrated circuit including conventional ESD protection circuits. In FIG. 2, only one of the conductive paths comprising diodes D1 and D2 is shown. However, the conductive path comprising diodes D3 and D4 is similar.

Referring to FIG. 2, p+ and n+ regions 22 and 24 correspond to the anode and cathode of diode D1 respectively, and p+ and n+ regions 32 and 34 correspond to anode and cathode of diode D2 respectively. The first and second diodes D1 and D2 are contained in respective first and second well regions 20 and 30 in an integrated circuit substrate such as a semiconductor substrate 10. A p-well region 40 is included between first and second regions 20 and 30. P-well region 40 acts as an isolation region between the n-well regions 20 and 30. As shown, the first and second well regions 20 and 30 include respective first and second circumferences or walls. N-type buried layers 12 and 14 are also included in substrate 10 beneath the n-well regions 20 and 30 respectively. As also shown, the first and second diodes are serially connected between the first and second pads 1 and 2 by a conductive line 5.

Conventional ESD protection circuits described in FIGS. 1 and 2 generally operate when the voltages Vcc1 and Vcc2 applied to the power supply pads 1 and 2 are equal to each other. However, when the voltages Vcc1 and Vcc2 are at different levels, power dissipation may be caused due to the formation of parasitic bipolar transistors Q1 and Q2, shown in FIG. 2, or transistors Q3 and Q4 which would be formed by diodes D3 and D4. As shown in FIG. 3, the transistors Q1 and Q2 form a PNP Darlington pair which can produce high amplification.

For example, if Vcc1=5V and Vcc2=6V, the transistors Q1 and Q2 both conduct. Similarly, if Vcc1=6V and Vcc2=5V, transistors Q3 and Q4 both conduct. If the current gains of the transistors Q1 and Q2 are $\beta 1$ and $\beta 2$ respectively, the current gain $\beta$ of the PNP Darlington pair becomes $\beta 1 \cdot \beta 2$. As shown in FIG. 3, if $\beta 1=10$ and $\beta 2=10$, then I2, the base current of parasitic transistor Q2=3 mA and I1, the emitter current of transistor Q1 can become 300 mA or more.

This large leakage current can degrade the performance of the ESD protection circuit and can also increase the power dissipation of the integrated circuit. Moreover, the since the lateral resistance of the substrate 10 may vary based on the position thereof, latch-up may be caused by the parasitic components in the integrated circuit substrate 10. Finally, the formation of the parasitic transistors may reduce the effectiveness of the ESD protection circuit itself.

SUMMARY OF THE INVENTION

It is therefore an object of the present invention to provide improved ESD protection circuits for integrated circuits.

It is another object of the present invention to provide ESD protection circuits that can have reduced leakage current.

These and other objects are provided, according to the present invention, by ESD protection circuits that include means for reducing leakage currents in the diode-containing wells. The leakage currents may be reduced by preventing the formation of parasitic transistors in the ESD circuit.

ESD protection circuits according to the present invention preferably comprise first and second pads on an integrated circuit and first and second well regions in the integrated circuit substrate. The first and second well regions include respective first and second circumferences or walls. First and second diodes are included in the respective first and second well regions. The first and second diodes are serially connected between the first and second pads. A first guard ring is included adjacent the first circumference, and preferably in the first well. The first diode is included within the first guard ring. A second guard ring is also preferably included adjacent the second circumference, and more preferably in the second well. The second diode is included within the second guard ring.

The first and second well regions preferably are of first conductivity type, and the ESD protection circuit further comprises a third well region of second conductivity type in the integrated circuit substrate, between the first and second well regions. The first and second guard rings are of the first conductivity type at higher concentration than the first and second well regions.

The ESD protection circuit also preferably includes first and second buried regions, a respective one of which is beneath a respective one of the first and second well regions. The first guard ring preferably extends to the first buried region and the second guard ring preferably extends to the second buried region.

Accordingly, guard rings are formed around the diodes that are located in the wells. Because of the guard rings, the bases of the parasitic bipolar transistors may be heavily doped. This leads to an increase in the recombination rate of carriers at the bases of the transistors. As a result, the base currents of the transistors can approach zero and the parasitic transistor effect may be suppressed. Current dissipation may be reduced and the effectiveness of the ESD protection circuit may be increased.

DETAILED DESCRIPTION OF PREFERRED EMBODIMENTS

Figure 1:
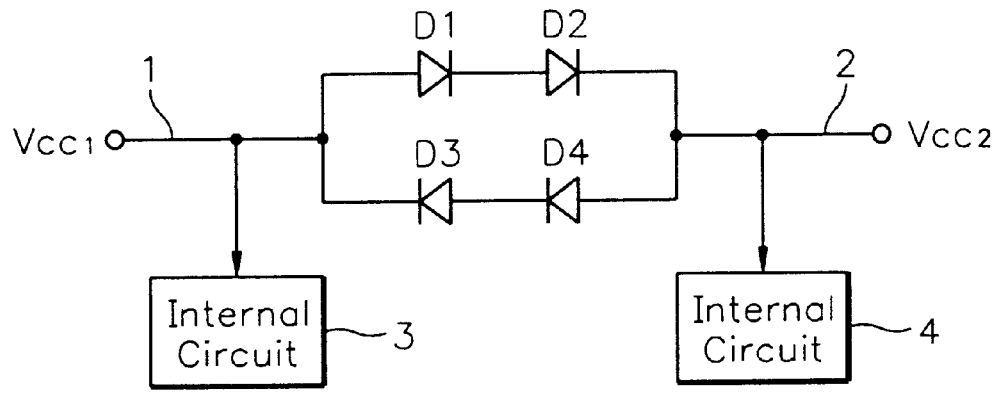
FIG. 1 is a circuit diagram of a conventional ESD protection circuit.
Figure 3:
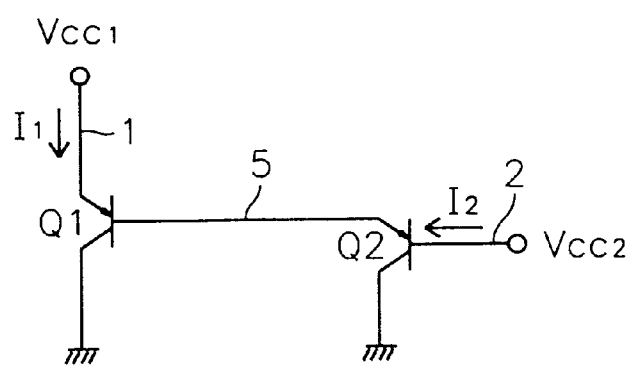
FIG. 3 is a circuit diagram of a parasitic Darlington pair that may be formed in the conventional ESD protection circuit of FIGS. 1 and 2.
Figure 2:
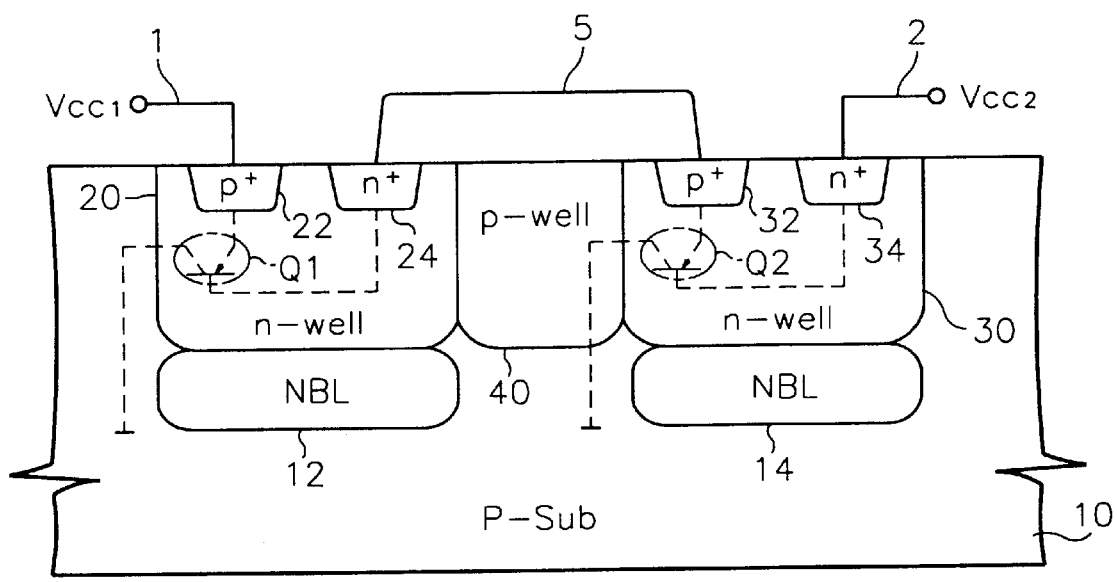
FIG. 2 is a cross-sectional view of an integrated circuit including a conventional ESD protection circuit.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 4:
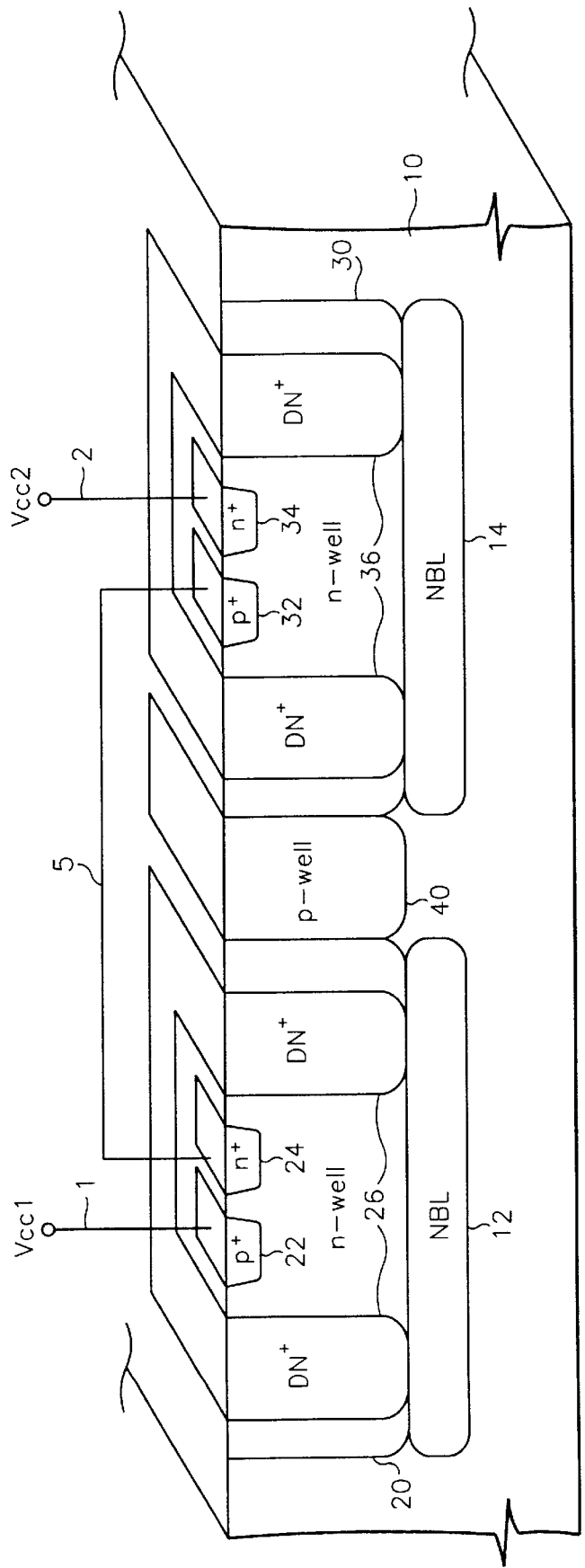
FIG. 4 is a cross-sectional view of ESD protection circuits according to the present invention.

Referring now to FIG. 4, a cross-sectional view of an integrated circuit substrate including electrostatic discharge (ESD) protection circuits according to the present invention is illustrated. As shown in FIG. 4, first and second pads 1 and 2 are included on an integrated circuit substrate such as a semiconductor substrate 10. First and second well regions 20 and 30 are included in the integrated circuit substrate. The first and second well regions 20 and 30 each include respective first and second circumferences or walls. First and second diodes are included in the respective first and second well regions. The first diode is formed by p+ region 22 and n+ region 24. The second diode is formed by p+ region 32 and n+ region 34. The first and second diodes are serially connected between the first and second pads 1 and 2 respectively, using conductor 5.

According to the invention, a first guard ring 26 is included adjacent the first circumference of the first well 20, and preferably in first well 20. The first diode is within the first guard ring. A second guard ring 36 is included adjacent the second circumference of second well 30, and preferably in the second well 30. The second diode is within the second guard ring.

As shown in FIG. 4, the first and second well regions are of first conductivity type, here n-type and the first and second guard rings are also of the first conductivity type, at a higher concentration than the first and second well regions. In FIG. 4, the higher concentration is denoted DN+.

As also shown in FIG. 4, first and second n-type buried regions (NBL) 12 and 14 are included. The first and second guard rings 26 and 36 extend to the first and second buried regions 12 and 14 respectively. Finally, as also shown in FIG. 4, a third well region 40 of second conductivity type, here p-type, is included in the integrated circuit substrate between the first and second well regions 20 and 30 respectively. P-well region 40 acts as an isolation film between the n-well regions 20 and 30. It will be understood that in FIG. 4, a second, parallel pair of diodes D3 and D4 are also connected between first and second pads 1 and 2.

The guard rings 26 and 36 cause the bases of parasitic bipolar transistors Q1 and Q2 (or Q3 and Q4) to be heavily doped. This leads to an increase in the recombination of carriers at the bases of transistors. As a result, the base current in these transistors can approach 0. Accordingly, although a Darlington pair of parasitic transistors Q1 and Q2 (or Q3 and Q4) may be formed by providing different voltages Vcc1 and Vcc2 to the power supply pads 1 and 2, leakage current is reduced and preferably eliminated in transistors Q1 and Q2 (and transistors Q3 and Q4).

Representative doping concentrations and dopants for the various regions of FIG. 4 may be as follows: p-well region 40 may be doped at a concentration of $10^{12}/cm^3$ with boron and n-well regions 20 and 30 may be doped at a doping concentration of $10^{12}/cm^3$ with $PH_3$. N-type buried regions 12 and 14 may be doped with arsenic at a concentration of $10^{15}/cm^3$. N+ type regions 24 and 34 of the diodes may be doped at a concentration of $10^{15}/cm^3$ with arsenic and p-type regions 22 and 32 of the diodes may be doped at concentrations of $10^{15}/cm^3$ with $BF_2$. The guard rings 26 and 36 may be doped at a concentration of $10^{15}/cm^3$ with $PH_3$. Accordingly, improved ESD protection may be provided by adding guard rings in the wells of an ESD circuit.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An electrostatic discharge (ESD) protection circuit for an integrated circuit, comprising:

first and second pads on an integrated circuit substrate;

first and second well regions in the integrated circuit substrate, including respective first and second well walls;

first and second diodes in the respective first and second well regions, the first and second diodes being serially connected between the first and second pads;

a first guard ring in the first well region adjacent the first well wall, the first diode being within the first guard ring in the first well region; and a second guard ring in the second well region adjacent the second well wall, the second diode being within the second guard ring in the second well region.

2. An ESD protection circuit according to claim 1 wherein the first and second well regions are of first conductivity type, the ESD protection circuit further comprising:

a third well region of second conductivity type in the integrated circuit substrate, between the first and second well regions.

3. An ESD protection circuit according to claim 1 wherein the first and second well regions are of first conductivity type, and wherein the first guard ring is of the first conductivity type, at higher concentration than the first and second well regions.

4. An ESD protection circuit according to claim 1 further comprising:

first and second buried regions, a respective one of which is beneath a respective one of the first and second well regions, and wherein the first guard ring extends to the first buried region.

5. An ESD protection circuit according to claim 1 wherein the first and second well regions are of first conductivity type, the ESD protection circuit further comprising:

a third well region of second conductivity type in the integrated circuit substrate, between the first and second well regions.

6. An ESD protection circuit according to claim 1 wherein the first and second well regions are of first conductivity type, and wherein the first and second guard rings are of the first conductivity type, at higher concentration than the first and second well regions.

7. An ESD protection circuit according to claim 1 further comprising:

first and second buried regions, a respective one of which is beneath a respective one of the first and second well regions, and wherein the first and second guard rings extend to the respective first and second buried regions.

8. An ESD protection circuit according to claim 1 further comprising:

a plurality of internal circuits in the integrated circuit substrate, wherein the first and second pads are also connected to the plurality of internal circuits.

9. An electrostatic discharge (ESD) protection circuit for an integrated circuit, comprising:

first and second pads on an integrated circuit substrate;

a well region in the integrated circuit substrate including a well wall;

a diode in the well region, the diode being serially connected between the first and second pads; and a guard ring in the well region adjacent the well wall, the diode being within the guard ring in the well region.

10. An ESD protection circuit according to claim 9 wherein the well region is a first well region of first conductivity type, the ESD protection circuit further comprising:

a second well region of second conductivity type in the integrated circuit substrate, outside the first well region.

11. An ESD protection circuit according to claim 9 wherein the well region is of first conductivity type, and wherein the guard ring is of the first conductivity type, at higher concentration than the well region.

12. An ESD protection circuit according to claim 9 further comprising:

a buried region beneath the well region, and wherein the guard ring extends to the buried region.

13. An ESD protection circuit according to claim 9 further comprising:

a plurality of internal circuits in the integrated circuit substrate, wherein the first and second pads are also connected to the plurality of internal circuits.

* * * * *